(12) United States Patent
Reiser et al.

(10) Patent No.: US 11,286,394 B2
(45) Date of Patent: Mar. 29, 2022

(54) CONDUCTIVE NANOCOMPOSITES

(71) Applicant: Leibniz-Institut für Neue Materialien gemeinnützige GmbH, Saarbrücken (DE)

(72) Inventors: Beate Reiser, Kaiserslautern (DE); Tobias Kraus, Saarbrücken (DE); Lola González-García, Saarbrücken (DE); Johannes H. M. Maurer, Homburg (DE); Ioannis Kanelidis, Saarbrücken (DE)

(73) Assignee: Leibniz-Institut für Neue Materialien gemeinnützige GmbH, Saarbrücken (DE)

( * ) Notice: Subject to any disclaimer, the term of this patent is extended or adjusted under 35 U.S.C. 154(b) by 0 days.

(21) Appl. No.: 15/756,993

(22) PCT Filed: Sep. 8, 2016

(86) PCT No.: PCT/EP2016/071132
§ 371 (c)(1),
(2) Date: Mar. 2, 2018

(87) PCT Pub. No.: WO2017/045989
PCT Pub. Date: Mar. 23, 2017

(65) Prior Publication Data
US 2018/0251640 A1 Sep. 6, 2018

(30) Foreign Application Priority Data
Sep. 15, 2015 (DE) .................... 10 2015 115 549.4

(51) Int. Cl.
*C09D 5/24* (2006.01)
*C09D 11/52* (2014.01)
(Continued)

(52) U.S. Cl.
CPC ............ *C09D 5/24* (2013.01); *B05D 3/0413* (2013.01); *B82Y 40/00* (2013.01); *C09D 7/62* (2018.01);
(Continued)

(58) Field of Classification Search
None
See application file for complete search history.

(56) References Cited

U.S. PATENT DOCUMENTS

| 7,686,983 B2 | 3/2010 | Englebienne et al. |
| 2003/0096113 A1* | 5/2003 | Jacobson ............... C09D 11/50 428/379 |

(Continued)

FOREIGN PATENT DOCUMENTS

| CN | 1743361 A | 3/2006 |
| CN | 102884589 A | 1/2013 |

(Continued)

OTHER PUBLICATIONS

International Preliminary Report on Patentability, dated Mar. 29, 2018.
(Continued)

*Primary Examiner* — Katie L. Hammer
(74) *Attorney, Agent, or Firm* — Cahn & Samuels, LLP

(57) ABSTRACT

Conductive or semiconductive nanoparticles are modified with conductive ligands so as to be able to obtain conductive or semiconductive layers without requiring a thermal treatment for forming the structures upon application of the layers. A composition can include a matrix polymer for producing conductive composites.

24 Claims, 11 Drawing Sheets

(51) Int. Cl.

| | |
|---|---|
| *C09D 11/322* | (2014.01) |
| *C09D 7/40* | (2018.01) |
| *H01B 1/20* | (2006.01) |
| *C09D 11/106* | (2014.01) |
| *C09D 7/62* | (2018.01) |
| *B82Y 40/00* | (2011.01) |
| *B05D 3/04* | (2006.01) |
| *C09D 11/037* | (2014.01) |
| *C09D 11/102* | (2014.01) |
| *C09D 165/00* | (2006.01) |
| *H01B 1/12* | (2006.01) |
| *H01B 1/22* | (2006.01) |
| *C08K 9/04* | (2006.01) |
| *C08K 3/08* | (2006.01) |
| *C08K 7/06* | (2006.01) |
| *C08K 7/00* | (2006.01) |
| *H01L 31/0224* | (2006.01) |

(52) U.S. Cl.
CPC .............. *C09D 7/70* (2018.01); *C09D 11/037* (2013.01); *C09D 11/102* (2013.01); *C09D 11/106* (2013.01); *C09D 11/322* (2013.01); *C09D 11/52* (2013.01); *C09D 165/00* (2013.01); *H01B 1/124* (2013.01); *H01B 1/20* (2013.01); *H01B 1/22* (2013.01); *C08K 3/08* (2013.01); *C08K 7/00* (2013.01); *C08K 7/06* (2013.01); *C08K 9/04* (2013.01); *C08K 2003/0831* (2013.01); *C08K 2201/001* (2013.01); *C08K 2201/011* (2013.01); *H01L 31/022425* (2013.01)

(56) References Cited

U.S. PATENT DOCUMENTS

| | | | |
|---|---|---|---|
| 2004/0079195 A1 | 4/2004 | Perry et al. | |
| 2004/0095658 A1* | 5/2004 | Buretea | B82Y 20/00 359/853 |
| 2005/0142030 A1* | 6/2005 | Kim | B82Y 15/00 422/400 |
| 2007/0057255 A1 | 3/2007 | Murray et al. | |
| 2009/0053512 A1* | 2/2009 | Pyun | G11B 5/712 428/336 |
| 2009/0286082 A1 | 11/2009 | Sohn et al. | |
| 2011/0052926 A1 | 3/2011 | Nakamura et al. | |
| 2011/0068322 A1* | 3/2011 | Pickett | C09K 11/02 257/13 |
| 2011/0068522 A1* | 3/2011 | Tierney | F27B 3/16 266/205 |
| 2011/0111138 A1* | 5/2011 | McCullough | C07F 1/005 427/595 |
| 2011/0124820 A1* | 5/2011 | Lee | C08G 61/126 525/280 |
| 2012/0138913 A1* | 6/2012 | Alsayed | H01B 1/02 257/40 |
| 2012/0175565 A1* | 7/2012 | Lovenich | C08G 61/126 252/500 |
| 2012/0208086 A1 | 8/2012 | Plieth et al. | |
| 2013/0001479 A1* | 1/2013 | Kanehara | C09D 11/52 252/519.2 |
| 2013/0007564 A1 | 1/2013 | Bedeschi | |
| 2013/0146801 A1 | 6/2013 | Huang et al. | |
| 2013/0221279 A1* | 8/2013 | Xu | B82Y 30/00 252/301.36 |
| 2015/0299562 A1* | 10/2015 | Buchholz | H01L 51/0007 252/519.21 |
| 2015/0344776 A1* | 12/2015 | Bootman | C09K 11/883 252/301.36 |
| 2016/0140994 A1* | 5/2016 | Chen | G03F 7/0002 216/37 |
| 2016/0162063 A1 | 6/2016 | Lovenich et al. | |

FOREIGN PATENT DOCUMENTS

| | | |
|---|---|---|
| DE | 102013002855 A1 | 8/2014 |
| EP | 2014718 B1 | 1/2010 |
| EP | 2400508 A1 | 12/2011 |
| KR | 1020140060442 A | 5/2014 |
| WO | 2013/007564 A1 | 1/2013 |

OTHER PUBLICATIONS

Hu et al., "Tunable multicolored hybrid metallic nanoparticles for live human cancer cell imaging," Journal of Nanophotonics 2010, 4, 041545, 1-7.
Chen et al., "Fabrication of Ag/Polypyrrole Coaxial Nanocables Through Common Ions Adsorption Effect," Synthetic Metals 156 (2006), 346-350.
Colle et al., "Structure and X-ray spectrum of crystalline poly(3-hexylthiophene) from DFT-van der Waals calculations", Phys. Status Solidi B 248, No. 6, (2011), 1360-1368.
Zhang et al., "Directed Self-Assembly of Hybrid Oxide/Polymer Core/Shell Nanowires with Transport Optimized Morphology for Photovoltaics", Adv. Mater. 2012, 24, 82-87.
Liu et al., "Self-organization of two-dimensional poly-(3-hexylthiophene) crystals on Au(111) surfaces", Nanoscale 2013, 5, 7936-7941.
Ye et al., "Using Binary Surfactant Mixtures to Simultaneously Improve the Dimensional Tunability and Monodispersity in the Seeded Growth of Gold Nanorods", Nano Lett. 2013, 13, 765-771.
Englebienne et al., "Gold-Conductive Polymer Nanoparticles: A Hybrid Material with Enhanced Photonic Reactivity to Environmental Stimuli", J. Coll. Interface Sci. 292 (2005) 445-454.
Minari et al., "Room-Temperature Printing of Organic Thin-Film Transistors with π-Junction Gold Nanoparticles", Adv. Funct. Mater. 2014, 24, 4886-4892.
Abe et al., "Electronic structure of phthalocyanine derivative-protected π-junction Au nanoparticles", Organic Electronics 15 (2014), 3465-3470.
Kanehara et al., "Gold (0) Porphyrins on Gold Nanoparticles", Angew Chem. Int. Ed. 2008, 47, 307-310.
Machine English Abstract of DE 102013002855, Aug. 21, 2014.
English Abstract of KR 1020140060442, May 20, 2014.
English Abstract of CN1743361 A, Mar. 8, 2006.
English Abstract for CN102884589 A, printed on Sep. 17, 2020.
Tao et al. "A Novel Kind of Conductive Inkjet Filled with Ag Nanorods," Acta Materiae Compositae Sinica, 2012, 29(4), 143-47.

* cited by examiner a)

AuNR@CTAB b)

AuNR@SOL a)

b)

c)

CONDUCTIVE NANOCOMPOSITES

This patent application is a U.S. national stage application of PCT international application PCT/EP2016/071132 filed on 8 Sep. 2016 and claims priority of German patent document 10 2015 115 549.4 filed on 15 Sep. 2015, the entireties of which are incorporated herein by reference

BACKGROUND OF THE INVENTION

Conductive structures on surfaces play an important role in microelectronics. However, the processes for producing and structuring said structures are often very complicated.

In recent years, systems in which such structures can be applied to surfaces by printing processes have been examined to an increasing extent. Such wet coating processes are significantly more versatile to use than the photolithography processes which are frequently employed.

Such processes require conductive inks which frequently contain conductive particles, in particular nanoparticles.

Suspensions containing corresponding nanoparticles are used for this purpose. After application to a surface, the solvent evaporates and the particles come into contact and thus make a conductive coating possible. However, in the case of nanoparticles the suspensions must additionally contain stabilizers which prevent aggregation of the nanoparticles.

These form an organic coating on the surface of the nanoparticles. This is frequently nonconductive. In the case of such suspensions, it is therefore necessary to carry out a heat treatment in order to remove the stabilizers form the surface of the nanoparticles.

This also applies when the particles are introduced in matrices, in particular polymer matrices. Sintering steps also influence the matrix polymer in an undesirable way. In addition, gaps are formed in the previously formed matrix structure on removal of the ligands, so that the superstructure may collapse.

Even though organic solvents frequently have low boiling points, solvents such as water, alcohols or mixtures thereof are preferred, for cost reasons alone. However, this makes it necessary for the suspensions in these solvents, too, to be stable.

Kanehara et al. Angew. Chem. Int. Ed. 2008, 47, 307-310; Abe et al. Organic Electronics 2014, 15, 3465-3470; Minari et al. Adv. Funct. Mater. 2014, 24, 4886-4892 and US 2013/0001479 A1 describe spherical nanoparticles which are modified with phthalocyanines. These form conductive ligands to form conductive structures from inks comprising polar solvents.

US 2007/0057255 A1 describes nanoparticles modified with tetrazoles.

Englebienne et al. J. Coll. Interface Sci. 2005, 292, 445-454 and U.S. Pat. No. 7,686,983 describe a mixture of a conductive polymer and nanoparticles based on polyaniline derivatives for chemical sensors.

The problem addressed by the invention is to provide a composition which allows simple production of conductive structures on surfaces. In addition, a process for producing such a composition and a process for producing conductive structures using such compositions should be provided.

SUMMARY OF THE INVENTION

This problem is solved by the inventions having the features of the independent claims. Advantageous embodiments of the inventions are defined in the dependent claims.

The wording of all claims is hereby incorporated by reference into the present description. The inventions also encompass all meaningful combinations, and in particular all combinations mentioned, of independent and/or dependent claims.

The problem is solved by a composition for producing conductive layers by wet coating (=ink), comprising
 a) at least one type of conductive or semiconductive nanostructures, where at least one conductive ligand is arranged on the surface of the nanostructures;
 b) at least one solvent.

The nanostructures are preferably inorganic nanostructures. They can be metallic nanostructures which comprise a metal, mixtures of two or more metals or an alloy of two or more metals. The metals are preferably selected from among gold, silver, copper, platinum, palladium, nickel, ruthenium, indium or rhodium. The nanostructures can also comprise conductive semiconductive oxides. Examples of such oxides, which can also be doped, are indium-tin oxide (ITO) or antimony-tin oxide (ATO).

Semiconductors of groups II-VI, III-V or IV or an alloy of such semiconductors are also possible. Examples are CdS, CdSe, CdTe, InP, InAs, ZnS, ZnSe, ZnTe, HgTe, GaN, GaP, GaAs, GaSb, InSb, Si, Ge, AlAs, PbSe or PbTe.

Preference is given to metallic nanostructures comprising gold, silver, copper, platinum, palladium, nickel, ruthenium, indium or rhodium, mixtures or alloys thereof.

The structures in question are nanostructures. This means that they are structures which have an extension of less than 200 nm (measured by means of TEM) in at least one dimension, preferably in at least two or all dimensions. Particles, in particular spherical particles, are also possible. The nanostructures can also have different extensions in various dimensions. Examples are nanorods which have a ratio of the longest dimension to each of the two other dimensions of in each case at least 1.5, preferably at least 2. Nanorods have the advantage that, if they are suitably arranged, the number of nanostructure-nanostructure interfaces is, for the same area, smaller than when spherical particles are used. This can improve the conductivity of such a structure.

The nanostructures are preferably nanorods (NR). These preferably have an aspect ratio of length to diameter of at least 1.5:1, in particular at least 2:1, preferably at least 3:1. The aspect ratio is preferably less than 100:1, in particular less than 50:1.

The nanorods preferably have a length of less than 1 μm, preferably less than 500 nm. The diameter in this case is preferably less than 500 nm, preferably less than 100 nm, in particular less than 50 nm, with the other dimension in each case corresponding to the aspect ratio.

The length of the nanorods is, independently thereof, preferably above 50 nm, in particular above 100 nm.

At least one conductive ligand is arranged on the surface of the nanostructures.

The ligand has the structure depicted in scheme 2. It is a conductive polymer whose polymer backbone adsorbs on the nanostructures either via its conjugated pi system or directly via a functionality in or in the direct vicinity of the conductive polymer backbone. In order to ensure increased stability, the polymer is a polymeric or oligomeric structure which has at least 10 bonding positions. These bonding positions allow coordinate bonding to the surface of the nanostructure;
 they are preferably bonded thereto. Furthermore, the ligand is characterized in that it has at least one side chain which does not belong to the conjugated pi system. By suitable selection of the side chain(s): polar groups to ensure colloidal stability in polar solvents and bulky nonpolar side chains to ensure colloidal stability in nonpolar solvents. The side chain can also be selected in such a way that it forms a further bond to, for example, a further polymer which bears the suitable functional groups.

For the purposes of the present invention, bonding position is the formation of an at least coordinate bond to the surface of the nanostructure. This preferably occurs via heteroatoms such as O, N, Se or S, in particular S. Sulfur is the preferred bonding position in the case of metallic surfaces.

The conductive ligand therefore preferably comprises a conductive polymer. Such polymers are polymers having a conjugated pi system as backbone.

Such conductive polymers are, for example, polymers based on pyrrole, e.g. polypyrrole, poly(N-substituted pyrrole), poly(3-substituted pyrrole) and poly(3,4-substituted pyrrole); thiophene, e.g. polythiophene, poly(3-substituted thiophene), poly(3,4-substituted thiophene), polybenzothiophene, polyisothionaphthene, polyfurans, polybenzofurans, polycarbazoles, polyselenophenes, polyindoles, polypyridazines, polyanilines, polymethoxyphenylenes. The polymers can also be copolymers or block copolymers with other monomers.

Preferred polymers are polythiophenes, polypyrroles apart from poly(N-substituted pyrrole), polyfurans, polybenzofurans, polybenzothiophenes, polycarbazoles, preferably polythiophenes such as polythiophene, poly(3-substituted thiophene), poly(3,4-substituted thiophene) and polybenzothiophene. In these polymers, the heteroatoms of the monomers form the bonding positions to the surface of the nanostructure. When there are at least ten bonding positions, the polymer or oligomer has at least ten monomer units. Preference is given to ligands having at least 50, in particular at least 100, bonding positions.

Independently thereof, the ligand preferably has not more than 2000, in particular not more than 1500, bonding positions. A bonding position preferably corresponds to one monomer of a polymer and/or oligomer.

Examples of further monomers when the ligand comprises further monomers are, for example, styrenesulfonic acid or polystyrenesulfonic acid.

Examples of thiophenes are ethylene-3,4-dioxythiophene, 2-(3-thienyl)ethoxy-4-butylsulfonate (e.g. sodium salt), 3-hexylthiophene and the corresponding polythiophenes poly(ethylene-3,4-dioxythiophene), poly(2-(3-thienyl)ethoxy-4-butylsulfonate), poly(3-hexylthiophene).

The side chain of the ligand can, for example, have at least one polar group, which increases the compatibility with polar solvents. Examples of such groups are amino groups, hydroxyl groups, carboxyl groups, ester groups, halogens, thiols, ether groups, thioether groups, sulfate groups, sulfonic acid groups, amide groups, nitro groups, cyano groups, phosphonate groups.

The side chain is preferably an aliphatic branched or unbranched carbon chain comprising from 4 to 25 carbon atoms, with one or more nonadjacent $CH_2$ groups being able to be replaced by O, NR or S, where R is hydrogen or an aliphatic radical having from 1 to 10 carbon atoms, which comprises the at least one polar group as constituent.

The ligand can also comprise more than one polar group. Preference is given to at least five polar groups per ligand.

At least one functional group per ligand is preferred. Preference is given to groups which is such that the ligand has a nett charge in a pH range from 4 to 10 being present. It is also possible for at least one functional group per monomer to be present.

The side chain of the ligand can also have at least one nonpolar group which increases the compatibility with nonpolar/hydrophobic solvents. Examples are aliphatic or cycloaliphatic, hydrocarbon chains having from 4 to 25 carbon atoms and/or aromatic groups having from 6 to 20 carbon atoms. It is also possible for heteroatoms such as silane structures to be present.

Examples of such groups are alkyl groups such as butyl, pentyl, hexyl, heptyl, octyl, nonyl, decyl, undecyl, dodecyl unbranched groups or as constitutional isomers having the same number of carbon atoms. Examples of cycloaliphatic groups are cyclohexyl, cycloheptyl. Examples of aromatic groups are phenyl, naphthyl, anthracyl, peryl. The side chain can also comprise a plurality of these groups.

The ligand can also comprise side chains having polar groups and side chains having nonpolar groups. It is also possible for a plurality of different polar or nonpolar groups to be present.

The side chain can also be selected so that it binds a further compound, e.g. a further polymer, which bears the appropriate functional groups.

The composition can also comprise at least one further polymer which binds the ligands and bears an appropriate side chain.

Thus, for example, polymers having aromatic groups such as polystyrenes can become attached to the pi system of the conductive polymer or oligomer. It is also possible to use polymers having different charges. Thus, charged polymers can interact with the conductive ligand when the latter can bear an opposite charge. This can also be the case temporarily.

In this case, this further oligomer bears at least one appropriate side chain as described above, in particular for producing solubility in a solvent.

Preference is given to a combination of a substituted or unsubstituted thiophene as ligand and a polystyrene having at least one polar side group, in particular charged, for example polymers or oligomers of styrenesulfonic acid (PSS).

The composition then comprises not only the ligand but also at least one further polymer or oligomer which interacts with the ligand and thus improves the solubility of the ligand in the composition. The ligand and the at least one further polymer can be present in various weight ratios, for example in the range from 5:1 to 1:5 or from 2:1 to 1:2, in particular from 1.5:1 to 1:1.5.

A preferred combination is poly(ethylene-3,4-dioxythiophene) (PEDOT) with polystyrenesulfonic acid (PSS).

The ligand is preferably a polymer or oligomer having an average molecular mass of at least 5 kDa, preferably not more than 1000 kDa (measured using gel permeation chromatography), preferably from at least 10 kDa to 500 kDa, in particular from 30 kDa to 100 kDa.

In a preferred embodiment of the invention, the composition comprises at least one matrix polymer. This can be a conductive or nonconductive polymer, with preference being given to a nonconductive polymer. Conductive polymers have been defined above.

The matrix polymer is preferably present as a solution in the composition. For this purpose, it can be necessary to select a suitable solvent.

Preferred matrix polymers are customary soluble polymers such as polystyrene, polyacrylates such as polymethyl methacrylate, polyvinyl alcohol or polyvinylpyrrolidone or mixtures thereof.

The proportion of the nanostructures is preferably at least 10% by weight, in particular at least 30% by weight, based on the composition without solvent. The proportion of the nanostructures can be up to 90% by weight. Preferred proportions are from 10% by weight to 90% by weight, in particular from 20% by weight to 80% by weight, very particularly preferably from 30% by weight to 70% by weight.

The combination of conductive ligand and nanostructure is also referred to as type I composite. When a matrix polymer is additionally present, the combination will hereinafter be referred to as type II composite.

The use of a conductive ligand makes it possible to avoid the problems arising from the removal of the ligands which has hitherto been necessary. Thus, it is possible to produce composites of type II in one process step from an ink having a suitable composition. The sintering step normally also influences the matrix polymer in an undesirable way, but since no sintering step is necessary when using the ligands according to the invention, this problem is solved by the invention. In addition, as a result of the use of ligands according to the invention, there is no longer a risk of gaps in the previously formed structure arising on removal of bulky ligand shells, which may lead to the superstructure collapsing.

Preferred compositions of type II do not require a separate sintering step, usually at temperatures above 100° C.

The solvent is preferably selected from among solvents or solvent mixtures composed of solvents having, in each case, a boiling point of less than 120° C. Such solvents allow the solvent to be removed quickly at low temperatures, for example below 60° C.

The solvent is preferably a volatile solvent, in particular a solvent which is volatile at room temperature.

Examples of such solvents are water, alcohols, ketones or ethers, and also mixtures thereof. Further solvents can be present.

The further solvent can, for example, be selected from among alkanes, aromatics and heteroaromatics, cyclic aromatics, esters, ketones, amides, sulfonates.

The solvent can comprise at least one alcohol. The at least one alcohol is preferably an alcohol having up to ten carbon atoms. Examples of such alcohol are methanol, ethanol, n-propanol, isopropanol, n-butanol, i-butanol, 2-butanol, tert-butanol, 1-pentanol, 2-methyl-1-butanol, 3-methyl-1-butanol, hexanol, heptanol, octanol, 1-octanol, 1-nonanol, 1-decanol, allyl alcohol, crotyl alcohol, propargyl alcohol, cyclopentanol, cyclohexanol, 2-methoxyethanol, 2-ethoxyethanol, 2-butoxyethanol, ethylene glycol, propylene glycol.

Examples of ketones are acetone, methyl ethyl ketone, methyl isobutyl ketone.

Examples of esters are ethyl acetate, methyl acetate, propyl acetate, butyl acetate, ethyl butyrate, methyl butyrate, ethyl propionate, methyl propionate, propyl propionate.

Examples of alkanes are pentane, hexane, heptane, octane, nonane and constitutional isomers thereof and also corresponding cyclic compounds having the same number of carbons, e.g. cyclohexane.

For type I composites, the solvent is preferably selected from among water, alcohol or mixtures comprising water and/or at least one alcohol.

Type II composites require the matrix polymer also to be soluble in a sufficient amount in the given solvent. Preference is therefore given to selecting a solvent in which customary polymers such as polystyrene, polymethyl methacrylate, polyvinyl alcohol or polyvinylpyrrolidone are soluble. Examples of such solvents are acetone, cyclohexane and water, and also mixtures thereof.

The choice of the solvent also determines the colloidal stability of the dispersion. This can be influenced by suitable functional groups on the surface of the nanostructures, for example introduced by means of ligands.

In polar solvents, the absolute value of the zeta potential of the nanostructure in the composition in the pH range of 5-9 is preferably greater than 5 mV.

The content of the ligand relative to nanostructure is preferably selected so that the maximum thickness of the ligand shell on the surface of the nanostructure is less than 5 nm, in particular less than 2 nm (determined by TEM).

The degree of coverage of the nanostructure with ligand is preferably at least one monolayer on the total particle surface, but less than ten layers of ligand enveloping the particle surface. In the case of conjugated polymers, a coverage of at least one but not more than 50 monomer units per $nm^2$ of particle surface is preferred, independently of the Mw. In particular, a coverage of at least two but not more than 20 monomer units per $nm^2$ of particle surface is preferred. These figures can be calculated from TEM measurements in combination with gravimetric determination of the proportion of organic material.

In addition, appropriate selection of the groups of the ligand and the solubility which can be adjusted thereby makes it possible to arrange two layers on top of one another and select the solvents "orthogonally" so that the layer underneath is not dissolved by the solvent of the new ink (e.g. in the case of "solution processed" solar cells in the "layer-by-layer" approach).

The component a) of the composition of the invention can be obtained in various ways. Thus, the conductive ligand can be used as early as in the production of the nanostructures, for example by precipitation or reduction.

In another embodiment, the conductive ligand is introduced by ligand exchange. For this purpose, a process comprising the following steps is preferably carried out:
   a) provision of a dispersion of conductive or semiconductive nanostructures, with the dispersion being stabilized by at least one first ligand;
   b) addition of at least one conductive ligand;
   c) replacement of at least part of the first ligand by the at least one conductive ligand.

In the following, individual process steps are described in more detail. These steps do not necessarily have to be carried out in the indicated order, and the process to be illustrated can also comprise further steps which are not mentioned.

In this process, a nanostructure having a conductive ligand on the surface is produced or a nanostructure whose nonconductive ligand present on the surface is replaced by a conductive ligand is produced. Here, the colloidal stability of the dispersion must not be adversely affected. Otherwise, aggregation of the nanoparticles will occur.

In the case of ligand exchange, a dispersion of conductive or semiconductive nanostructures, which is stabilized by at least one first ligand, is provided. Suitable nanostructures are those described for the compositions.

The dispersion is stabilized by at least one first ligand. This means that the dispersion remains stable under the conditions of the ligand exchange. Thus, for example, the concentration of the excess of this ligand can be above 20

µM, but below 10 mM, with preference being given to a concentration in the range from 30 µM to 1 mM, in particular from 50 µm to 800 µM.

The at least one first ligand in this case preferably comprises at least one group for coordination to the surface of the nanostructure. As a result, it can form the required surface layer, which prevents aggregation of the structures. The ligand is preferably not covalently bound, like, for example, thiols on gold surfaces.

Examples of such ligands are ligands comprising carbonic acid groups, ammonium groups such as tetraalkylammonium groups, amino groups. Examples of such first ligands are citrates or cetyltrimethylammonium bromide (CTAB).

It may be necessary to remove a possible excess of first ligand. This can, for example, occur by means of centrifugation and redispersion. It is important that the colloidal stability is still ensured here.

In order to avoid aggregation, it can be advantageous to set the concentration of the nanostructures to a low value. Preference is given to a concentration of less than 10 mg/ml, in particular less than 4 mg/ml, very particularly preferably less than 1 mg/ml.

To ensure sufficient coverage of the surface of the nanostructures and thus also a sufficient colloidal stability, the at least one conductive ligand is preferably used in a concentration of at least 0.5 µg of polymer per $cm^2$ of particle surface. The area is determined by means of DLS or TEM measurements. The aggregation of the particles in the dispersion occurs, in particular, only on removal of the solvent. Compositions according to the invention are preferably stable, i.e. no aggregation can be found by means of UVvis, for at least 24 hours, in particular at least one week, very particularly preferably at least one month.

The nanostructures are preferably incubated with the at least one conductive ligand for at least one hour, particularly preferably at least five hours. Preference is given to at least 12 hours. Times from five hours to 100 hours, in particular from 12 to 36 hours, are possible.

During this time, at least part of the first ligand is replaced by the at least one conductive ligand, with preference being given to complete exchange.

After exchange is complete, it can be necessary to remove unadsorbed ligands. For this purpose, the dispersion can be purified and concentrated by centrifugation and discarding of the supernatant liquid. Furthermore, the solvent for the composition of the ink can be selected in this step. Drying of the dispersion should not occur here. The particles modified by means of the ligand preferably always remain wetted with solvent.

The invention also provides a process for producing a conductive or semiconductive layer on a surface, comprising the following steps:
a) application of a composition according to the invention to a surface;
b) removal of the at least one solvent.

Individual process steps are described in more detail below. The steps do not necessarily have to be carried out in the indicated order, and the process to be illustrated can also have further steps which are not mentioned.

In a first step, the composition according to the invention is applied to a surface. This can occur by means of all methods for wet coating known to those skilled in the art. This can, for example, occur by means of inkjet printing, spraying, dipping, flooding, spraying, spin coating, doctor blade coating.

Corresponding to the method of application, the required concentration of the dispersion, the solvent and possible additives can be selected. The viscosity can also be matched correspondingly.

As solvents, preference is given to the solvents as described for the composition.

The material of the surface should be compatible with the composition used, in particular the solvent. Owing to the low temperatures, the material of the surface can be selected freely. It can be an organic or inorganic surface. It can, for example, comprise polymers, metals, semimetals, glass or ceramic.

In a preferred embodiment of the invention, the removal of the at least one solvent takes place at a temperature below 60° C., in particular below 40° C. Preference is given to temperatures in the range from 4° C. to 30° C.

It is also possible to employ subatmospheric pressure, in particular below 1 bar.

Due to the use of a conductive ligand, removal of this ligand is not necessary in order to produce the conductivity of the coating. Exchange of electrons between the particles can occur easily due to the ligand.

As a result, the additional thermal treatments which are necessary in the prior art in order to remove the ligand shell can be avoided. When the removal of the ligand shell is not necessary, the following advantages also arise:
an energy-consuming process step is dispensed with;
removal of a ligand having a given volume necessarily leads to a decrease in the space requirement of a particle by the given volume. This could lead to a previously built up structure breaking down, or if a monolayer of particles is present: the direct contact between the particles being lost.
Composites of type II can be produced directly by wet coating in one process step, and when selecting the matrix polymer, it is not necessary to ensure that removal of the ligand does not also remove the matrix polymer or adversely affect its properties.

In a preferred embodiment, the process does not comprise any treatment of the coating at temperatures above 60° C., in particular above 40° C., after application to the surface.

The invention additionally provides conductive or semiconductive structures obtained using the process of the invention.

The invention additionally provides a composite material comprising a conductive or semiconductive nanostructure, at least one conductive ligand and at least one matrix polymer which is preferably obtained from a composition according to the invention or from a process according to the invention.

The structure according to the invention or the composite material can be used in a variety of ways; for example in displays, conductor tracks, circuits, capacitors, solar cells.

Further details and features can be derived from the following description of preferred working examples in conjunction with the dependent claims. Here, the respective features can be realized either alone or two or more in combination with one another. The possibilities of solving the problem are not limited to the working examples. Thus, for example, indications of ranges always encompass all intermediate values which are not mentioned at all conceivable subintervals.

1. Production of Gold Nanorods with CTAB

Gold nanorods having aspect ratios of 20-50 nm diameter and 80-150 nm length were produced by a method according to Ye et al. For this purpose, a growth solution (500 ml-2 l) was prepared using $AuCl_4$ (0.5 mM), cetyltrimethylammonium bromide (CTAB 0.4 M), sodium oleate (800 mM), ascorbic acid (0.16 mM), and various volumes of silver nitrate solution (4 mM) and HCl (32%). Anisotropic crystal growth was triggered by addition of a particular volume of spherical gold nuclei. This nucleus dispersion was produced beforehand by reduction of 5 ml of $HAuCl_4$ (0.25 mM) in aqueous CTAB solution (0.1 M) by means of $NaBH_4$ and incubation for 30 minutes. The reaction was left to rest for 14 hours at 35° C. The gold nanorods (AuNR) were then purified by centrifugation and stored in a CTAB solution (1 mM). The process could be scaled up to a size of 2 L, which corresponds to a dry mass of gold nanorods of about 200 mg of gold+additional ligand mass (corresponding to 210 mg). The gold nanorods produced have a deviation in diameter and length of less than 10% based on the cross section (measured by TEM). For dispersions, a zeta potential of +20 mV at pH 7 was measured. This indicates an average colloidal stability in respect of purely electrostatic stabilization. The ligand/metal ratio was determined thermogravimetrically at about 5:95 (m/m). Assuming a cylindrical shape having a diameter of 20 nm and a length of 100 nm (determined by TEM), this corresponds to a monolayer of 8 CTAB molecules per $nm^2$. CTAB tends to form double layers in an aqueous environment. It is assumed that the monolayer on the gold rods has four or fewer molecules of CTAB per $nm^2$.

2. Ligand Exchange

The gold nanorods stabilized by means of CTAB (AuNR@CTAB) produced as per item 1 were washed in order to remove the excess of CTAB and set the desired gold content. For this purpose, a solution of the polymer (0.5 mg/ml of poly(2-(3-thienyl)ethoxy-4-butylsulfonate (PTEBS) 40-70 kDa) in water) was added and stirred with the dispersion of AuNR@CTAB (0.5 mg/ml of gold in water) for 24 hours at room temperature. The gold nanorods were purified by redispersion in a particular volume of pure solvent and brought to a desired target concentration. The zeta potential changed from +20 mV to −45 mV (pH 7), which indicates successful exchange of the ligands. Successful ligand exchange was confirmed by spectroscopic methods. From transmission electron micrographs, the thickness of the ligand shell can be estimated as about 1 nm, which is in agreement with thermogravimetric measurements. From literature data, which in each case give information about the extension in one of the three dimensions (Liu et al. (Spacing of the monomers in the polythiophene backbone), Zhang et al. (Spacing which the polymer chains with this side chain preferably assume relative to one another), Colle et al. (p-stacking distance between conjugated polymers)), a padding density of the polymer of 7.2 monomers/$nm^3$ could be calculated for the polymer used, and the thickness of the ligand shell was likewise determined as 1 nm from the decrease in mass on heating.

A decrease in mass of 3.2% by weight was found for crystalline gold nanorods having dimensions of 23 nm×103 nm. In the case of gold nanorods having a smaller surface area/volume ratio (25 nm×113 nm), a decrease in mass of 2.9% by weight was calculated. If the ratio of ligand mass/surface area is used, a value of 3.4 mg/$m^2$ of particle surface area is obtained for the ligand of 2.

The colloidal stability in suitable solvents, solvent mixtures and solvent/polymer mixtures was demonstrated by UVvis spectroscopy.

2.1. Ligand with Additional Polymer

A ligand exchange using PEDOT:PSS (poly(ethylene-3,4-dioxythiophene):polystyrenesulfonate) was carried out in a manner analogous to 2. The exchange of the ligands was confirmed by means of analyses. The dispersion obtained was stable for at least one week in polar solvents (isopropanol, acetone, methanol, ethanol). Coatings produced display a conductivity of 1 Ω/sq, which is even better than the conductivity of a nanostructure after removal of the ligand.

2.2. Ligand for Nonpolar Solvents

Gold nanorods modified with poly(3-hexylthiophene-2,5-diyl, MN 15000-45000) were produced. For this purpose, the ligand was added during the synthesis. This ligand promotes the stability in nonpolar solvents (chloroform, toluene). The conductivity of the layers produced without sintering was measured.

2.3. Exchange on Gold Nanoparticles

A ligand exchange on gold particles (diameter 15 nm, stabilized by means of citrate) was carried out in a manner analogous to 2. The zeta potential changed from −29.2 mV to 34.9 mV, which indicates a moderate stability.

3. Production of Coatings

A dispersion in water/methanol (10:90) of gold nanorods modified according to the invention was applied to a glass substrate. A straight line was produced by means of a mold. Commercially available silver paint was used for the electrodes.

Composite type II: a dispersion in acetone/water (97.5/2.5; v/v) of gold nanorods modified according to the invention with dissolved PMMA is applied by drop casting onto a glass surface (1×1 cm) and a conductive composite is formed by evaporation of the solvent (40° C., 5 min.).

The working examples are schematically depicted in the figures. Identical reference symbols in the individual figures denote identical elements or elements which have the same function or correspond to one another in respect of their functions. In detail, the figures show:

Figure 9:
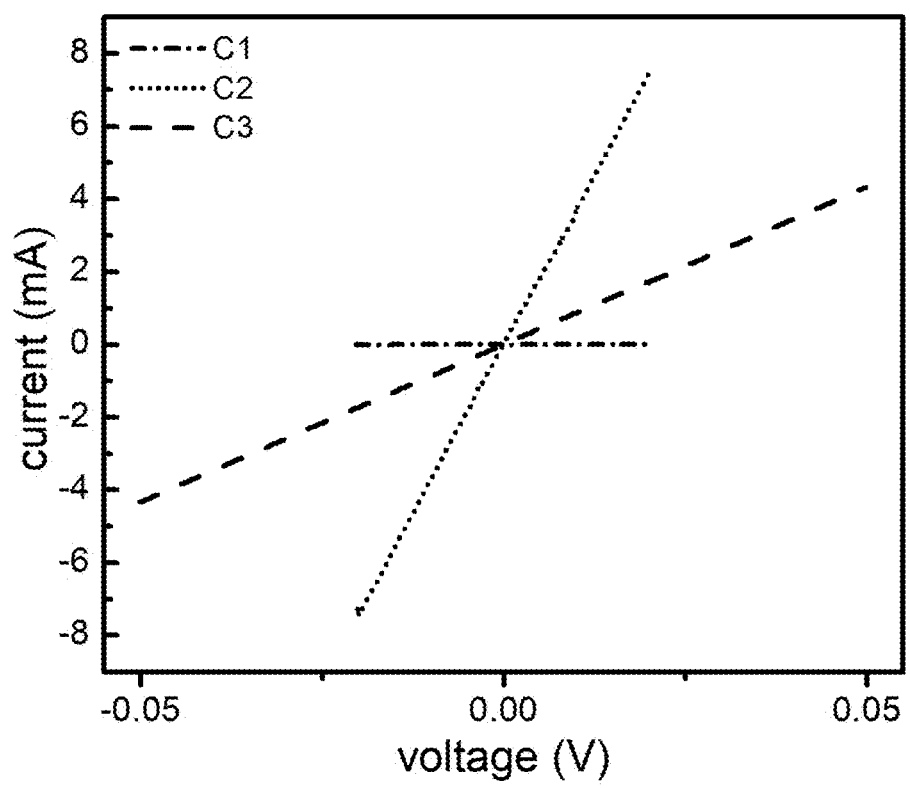
Figure 10:
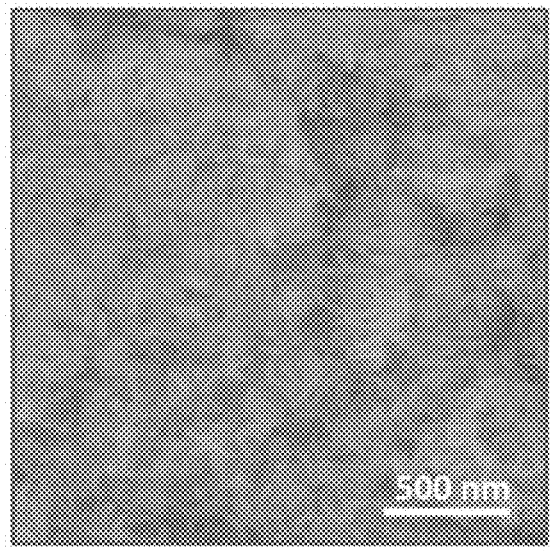
Figure 10:
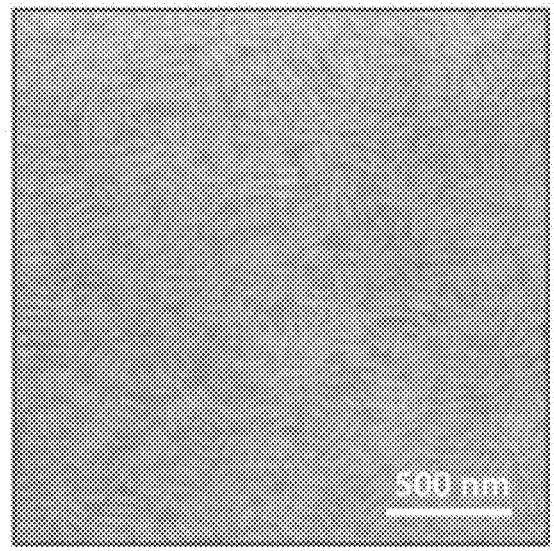
Figure 10:
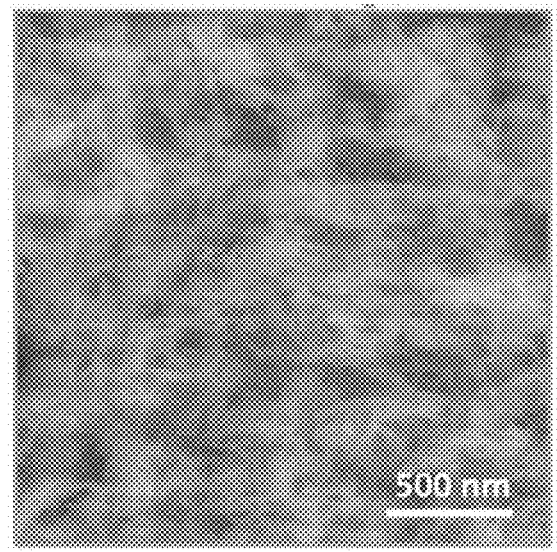
Figure 11:
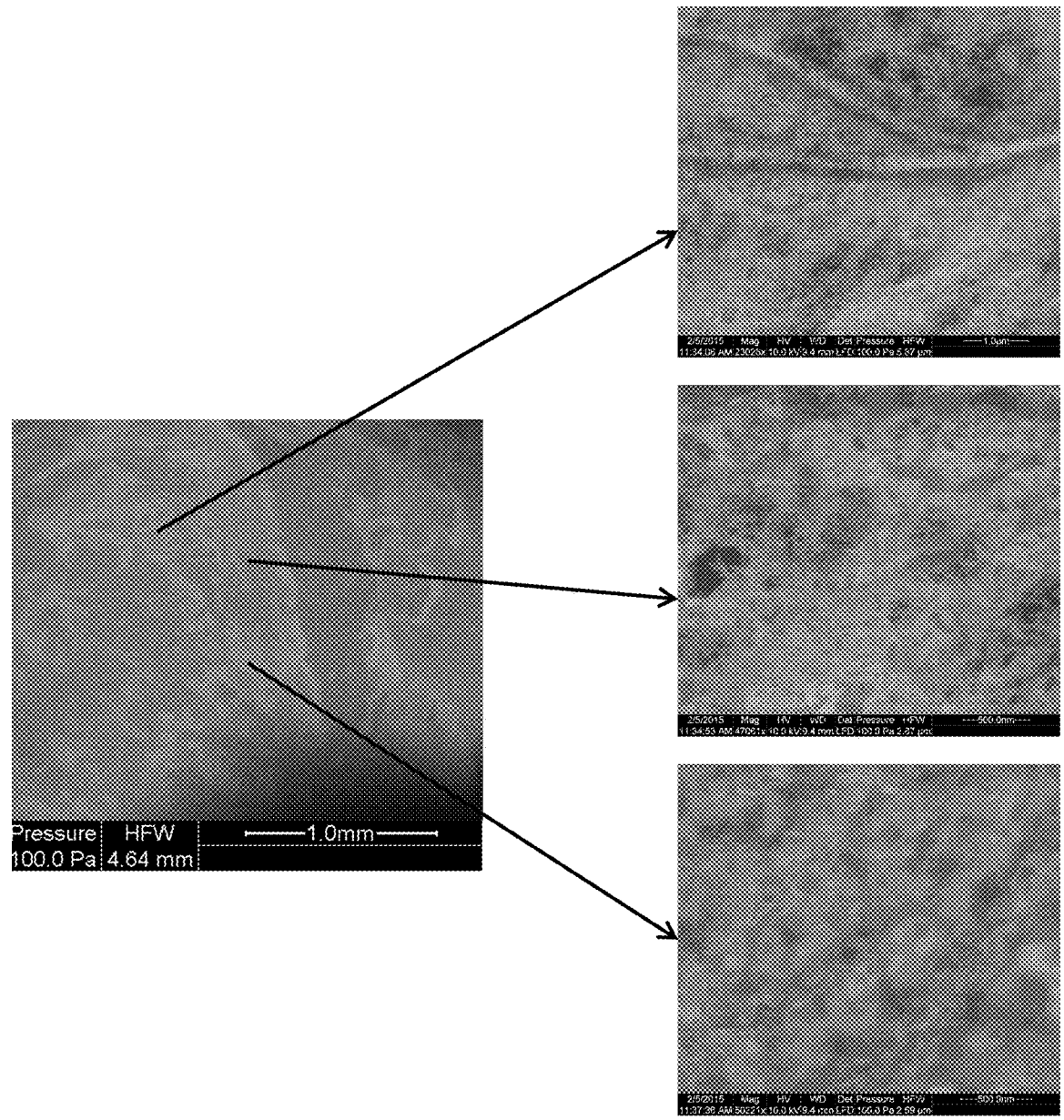

water; B: water/methanol (25/75; v/v); C: water/acetone (25/75; v/v); the wavelength is plotted against the absorbance;

FIG. 9 current/voltage graph for various coatings (C1: gold nanorods modified by means of PEG-SH; C2: gold nanorods modified by means of PEG-SH after $O_2$ plasma treatment (resistance R=2.7Ω); C3: gold nanorods with ligands according to the invention (resistance R=11.5Ω); the voltage is plotted against the current;

FIG. 10 scanning electron micrographs of coatings produced ((a) gold nanorods with ligands according to the invention; (b) gold nanorods modified by means of PEG-SH; (c) gold nanorods modified by means of PEG-SH after $O_2$ plasma treatment;

FIG. 11 scanning electron micrographs of composites.

DETAILED DESCRIPTION OF INVENTION

Figure 1:
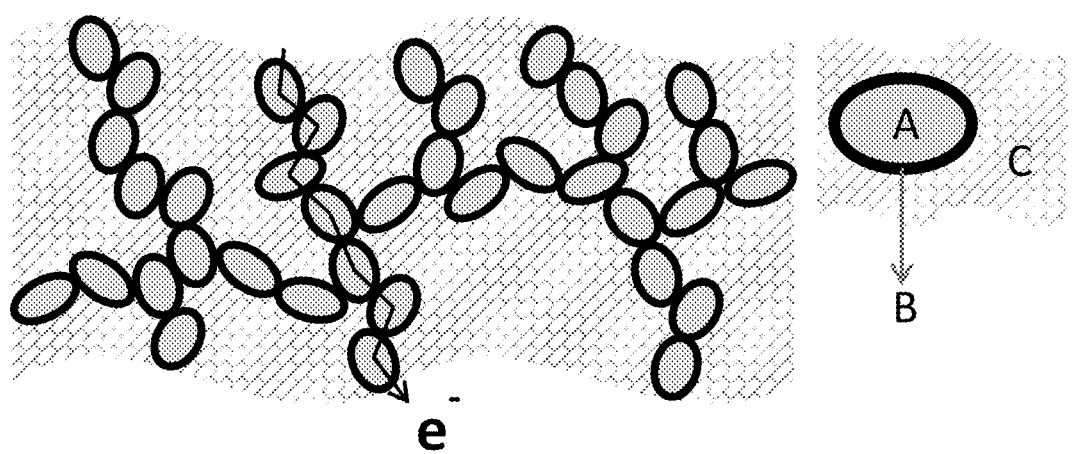
FIG. 1 schematic depiction of a structure according to the invention; A: nanostructure; B: conductive ligand; C: air or matrix.

FIG. 1 shows a schematic depiction of the composition according to the invention comprising nanorods. On the surface (type I) or in a matrix (type II), the nanorods adjoin one another in such a way that they form a conductive linear structure. The conductivity is increased by the significantly smaller number of interfaces along this structure.

Figure 2:
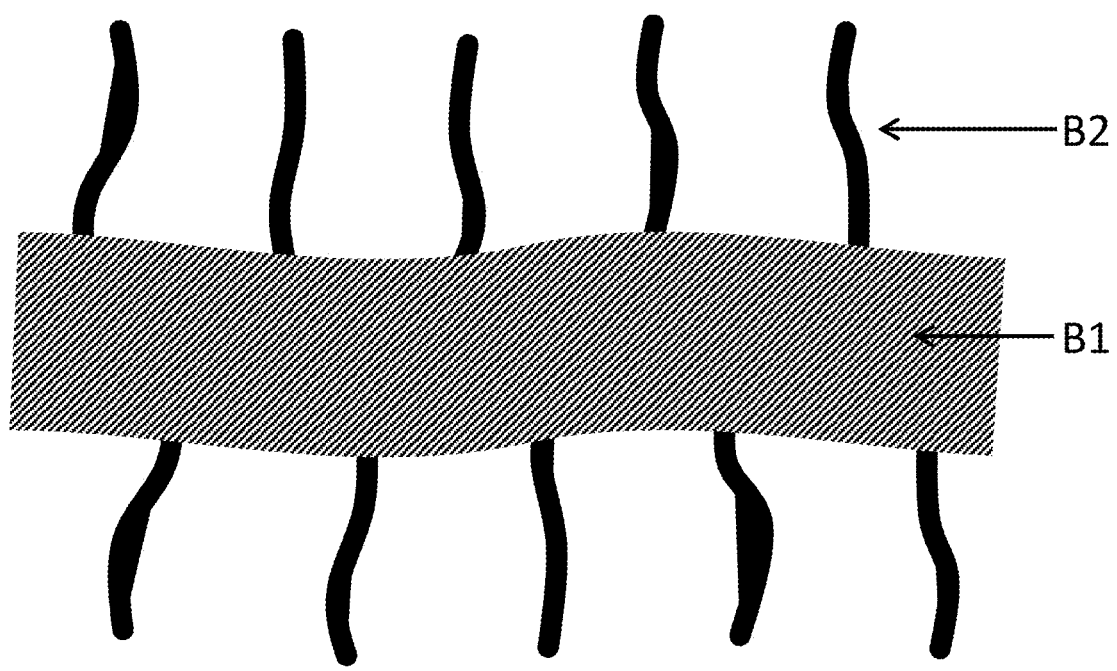
FIG. 2 schematic depiction of an embodiment of the conductive ligand (B1: conductive polymer backbone; B2: side chain covalently bound to the polymer backbone)

FIG. 2 shows a schematic depiction of a ligand according to the invention with polymer backbone and side chains.

Figure 3:
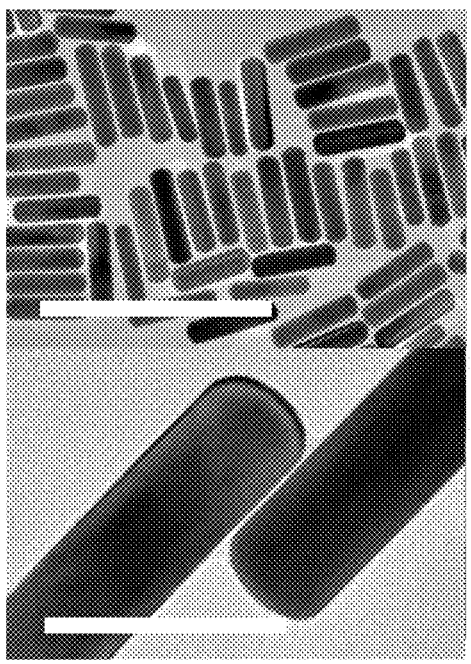
FIG. 3 a) transmission electron micrographs of gold nanorods with CTAB (AuNR@CTAB), scale bars: top: 400 nm; bottom: 100 nm; b) transmission electron micrographs showing gold nanorods with ligands according to the invention, scale bars: top: 200 nm; bottom: 50 nm.
Figure 3:
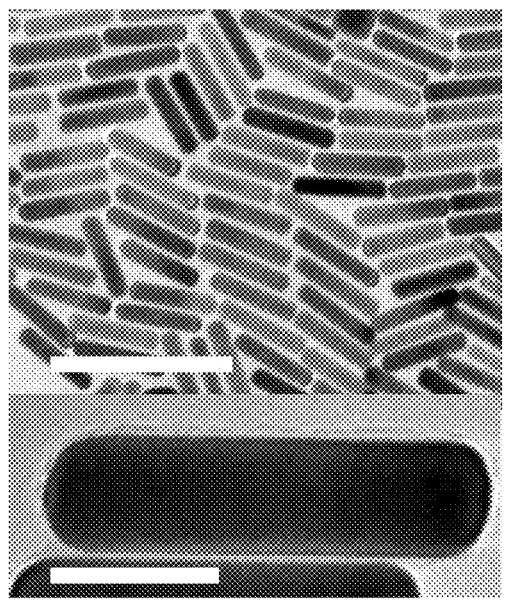

FIG. 3 shows that the structure of the gold nanorods and the ligand shell is retained on exchange of the ligands.

Figure 4:
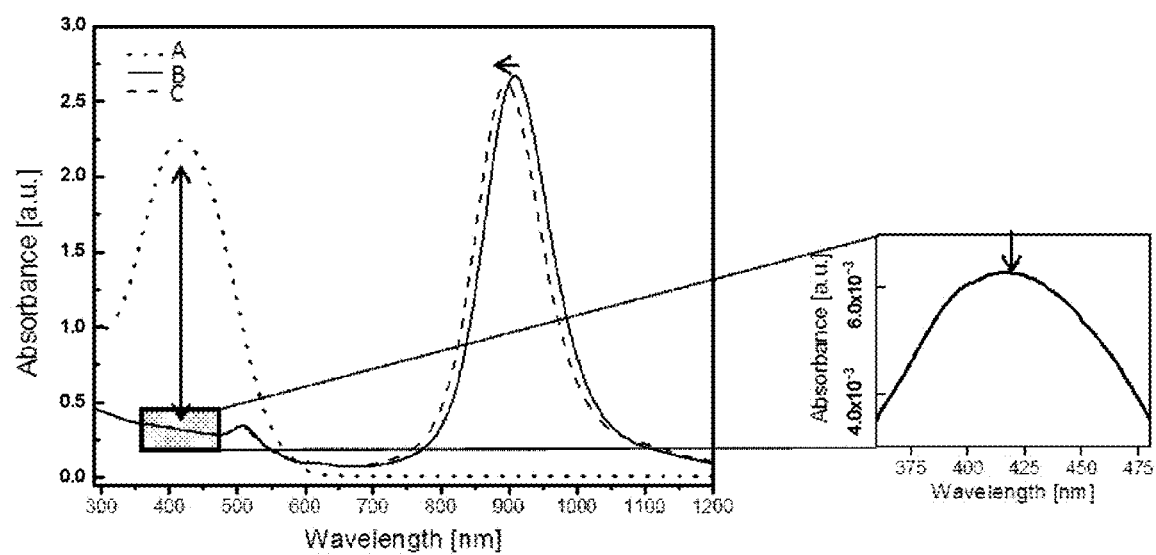
FIG. 4 UV-VIS spectra of the nanostructures and the ligands; wavelength is plotted against absorbance (A: pure ligand; B: gold nanostructure with CTAB as ligand; C: gold nanostructure with ligand according to the invention)

FIG. 4 shows UV-VIS spectra in water of the particles with CTAB (B), the pure ligand (A) and gold nanorods with ligands according to the invention (C). It can be seen that the replacement of the ligands shifts the absorption maximum at 900 nm slightly. The smaller graph shows a section from the subtraction of the spectra of the two modified nanostructures (C-B). The maximum of the ligand at 410 nm can then clearly be discerned from the subtraction.

Figure 5:
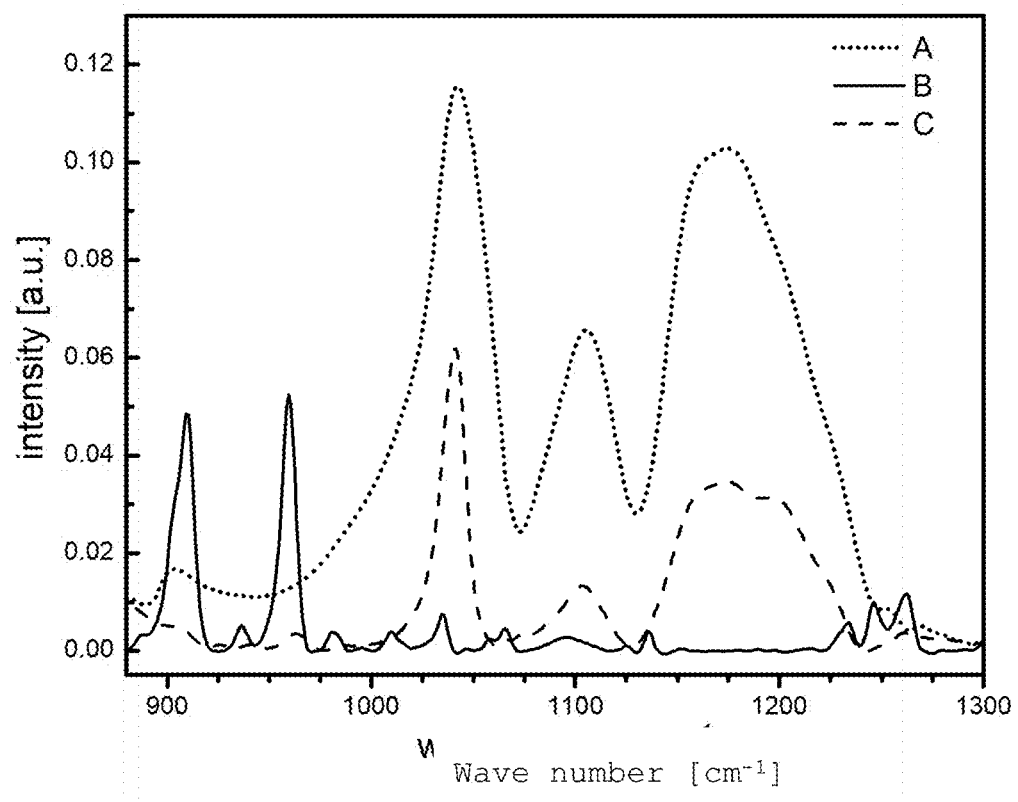
FIG. 5 IR spectra of the nanostructures and the ligands; the wave number is plotted against the intensity (A: pure ligand; B: gold nanostructure with CTAB as ligand; C: gold nanostructure with ligand according to the invention)

FIG. 5 shows the IR spectra of the gold nanorods with CTAB (AuNR@CTAB, B), the pure ligand (A) and gold nanorods with ligands according to the invention (C). The characteristic bands of the ligand (A) can be seen in the case of the modified gold nanorods (C). These are missing in the case of the CTAB-modified gold nanorods. This indicates that the ligand has been adsorbed on the surface of the particles.

Figure 6:
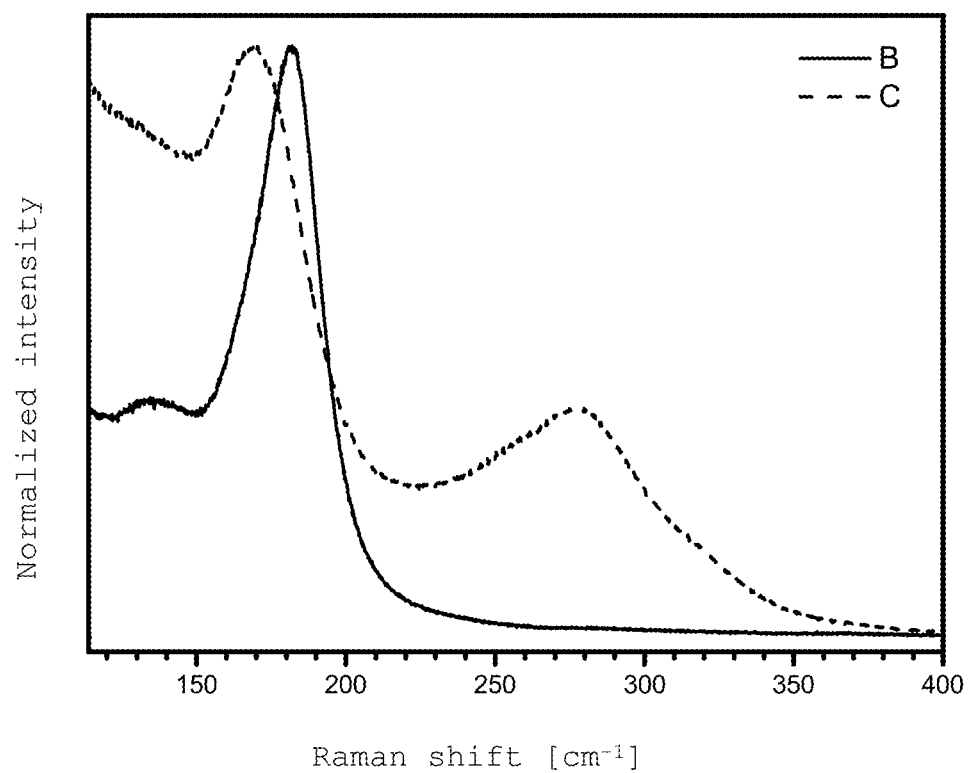
FIG. 6 Raman spectra of the nanostructures in each case before and after ligand exchange; the Raman shift is plotted against the normalized intensity (B: gold nanostructure with CTAB as ligand; C: gold nanostructure with ligand according to the invention)

FIG. 6 shows the Raman spectra (785 nm laser) of the gold nanorods with CTAB (AuNR@CTAB, B) and the gold nanorods with ligands according to the invention (C). In the case of the gold nanorods which have been modified according to the invention, the band at 278 cm$^{-1}$ of an Au—S band can be seen, while the band at 182 cm$^{-1}$ typical of an Au—Br bond is not to be seen. This shows that an interaction of the thiophene backbone with the surface of the gold nanorods occurs. Control experiments using thiophene on gold surfaces showed a similar pattern as the polythiophene ligand.

Figure 7:
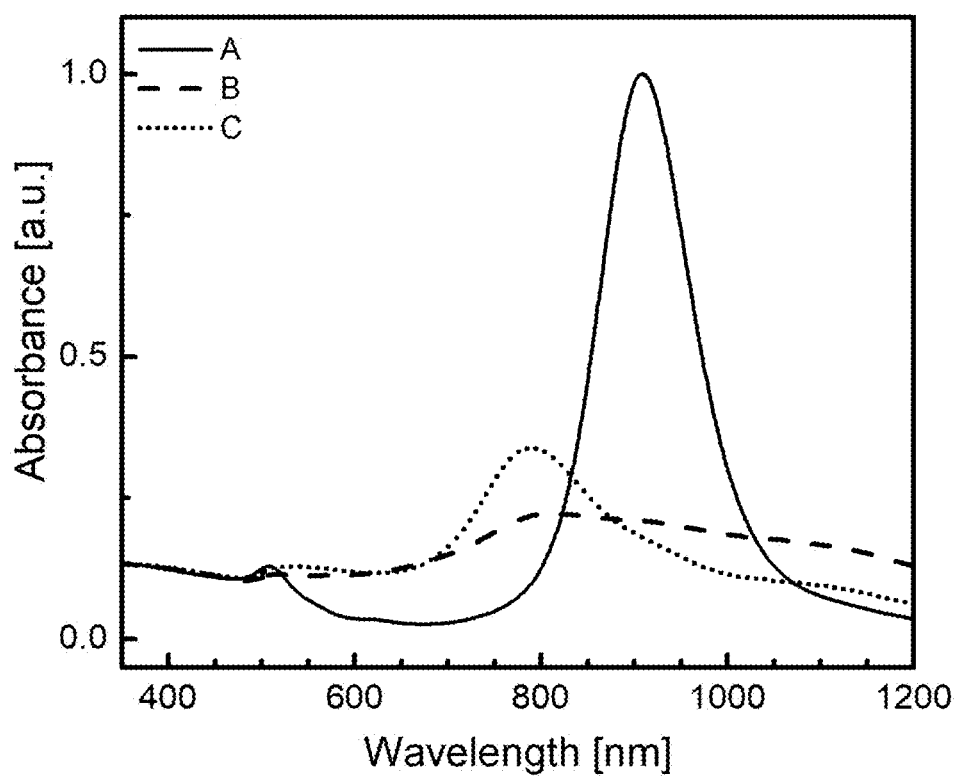
FIG. 7 absorbance of dispersions of AuNR@CTAB in various solvents (A: water; B: water/methanol (25/75; v/v); C: water/acetone (25/75; v/v); the wavelength is plotted against the absorbance.
Figure 8:
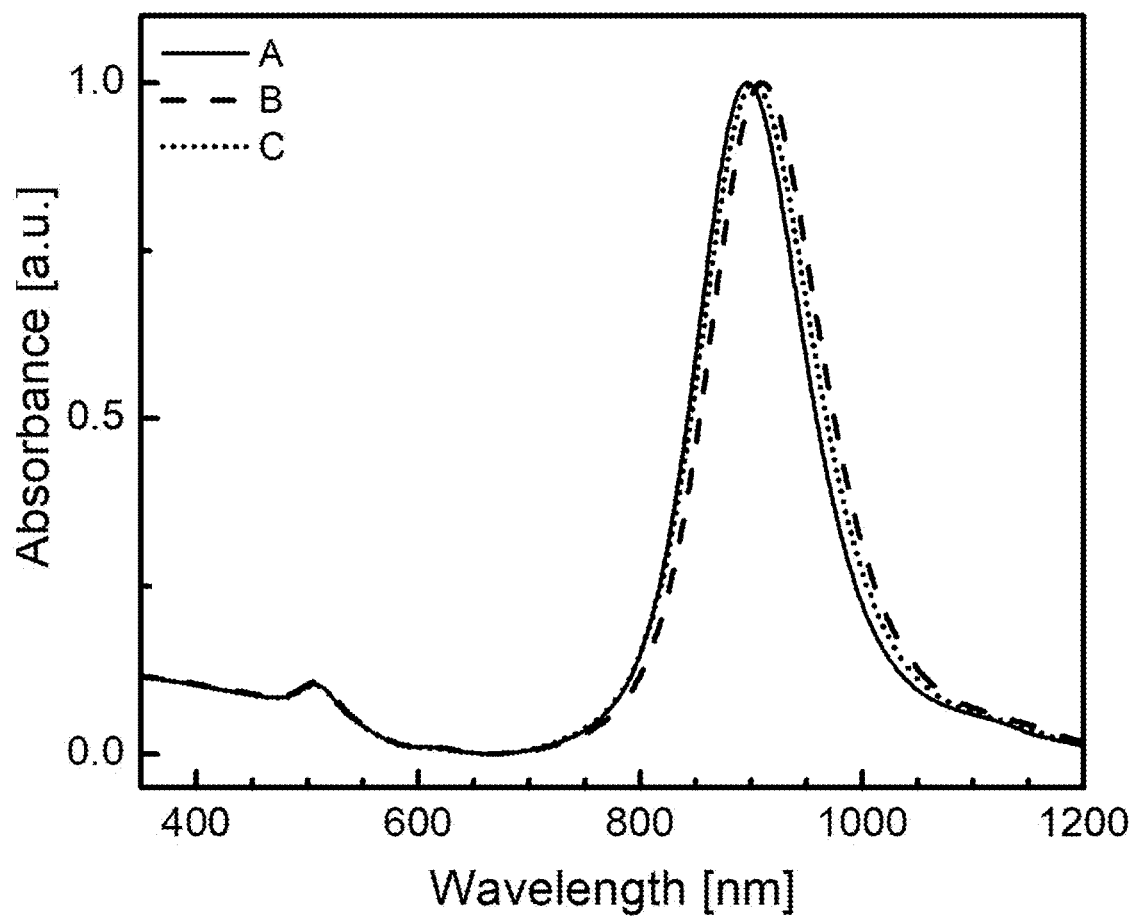
FIG. 8 absorbance of dispersions of gold nanorods with ligands according to the invention in various solvents (A.

FIGS. 7 and 8 show the stability of the dispersions in various solvents. These solvents are pure water (A), methanol/water (75/25, v/v) (B) and acetone/water (75/25, v/v). While the dispersions with ligands according to the invention were in all cases stable for at least six months and displayed virtually no change in the absorbance, the CTAB-modified gold nanorods are stable only in water. Even small amounts of other solvents lead to agglomeration and a large change in the absorption spectrum.

FIG. 9 shows current-voltage graphs for coatings obtained. The coatings composed of gold nanorods modified by means of PEG-SH (25 kDa) displayed no conductivity (C1). When these coatings were treated by means of an oxygen plasma for 30 minutes, they became conductive (C2). Raman measurements, however, show that the PEG-SH ligand is also removed thereby, as a result of which direct metal-metal contact is established.

The layers composed of the gold nanorods with ligands according to the invention are conductive immediately after drying without any further treatment.

FIG. 10 shows scanning electron micrographs of surfaces of the various modified gold nanorods.

FIG. 11 shows scanning electron micrographs of a conductive composite type II (this is gold nanorods with a conductive polymer as ligand, embedded in a PMMA matrix; the composite was produced by drop casting of an ink comprising these components in a solvent mixture of acetone and water 95.5/2.5 (v/v).

The composite shown is conductive and displays a resistance of 45Ω.

The matrix polymer can, for example, serve as "protective layer" or as insulating layer between a plurality of conductive layers. The nanostructure of the particle is also fixed by the matrix polymer and is thus more mechanically stable.

Numerous modifications and developments of the working examples described can be realized.

LITERATURE CITED

Kanehara et al. Angew. Chem. Int. Ed. 2008, 47, 307-310;
Abe et al. Organic Electronics 2014, 15, 3465-3470;
Minari et al. Adv. Funct. Mater. 2014, 24, 4886-4892
US 2013/0001479 A1
US 2007/0057255 A1
Englebienne et al. J. Coll. Interface Sci. 2005, 292, 445-454;
U.S. Pat. No. 7,686,983
Ye et al. Nano Lett. 2013, 13, 765-771;
Liu et al. Nanoscale 2013, 5, 7936-7941;
Zhang et al. Adv. Mater. 2012, 24, 82-87;
Colle et al. Phys. Status Solidi B 2011, 248, 1360-1368.

The invention claimed is:

1. A composition for producing conductive layers by wet coating, comprising:
    a) a plurality of conductive metallic nanostructures,
    b) a conductive polymer or oligomer based on thiophene; and
    c) at least one solvent, wherein the conductive polymer or oligomer has heteroatoms of the thiophene that form at least ten coordinate bonds to surfaces of the plurality of metallic nanostructures.

2. The composition as claimed in claim 1, wherein the nanostructures are nanorods having an aspect ratio of length to diameter of at least 2:1.

3. The composition as claimed in claim 1, wherein the composition further comprises a matrix polymer.

4. The composition as claimed in claim 3, wherein the matrix polymer is present as a solution in the composition.

5. The composition as claimed in claim 3, wherein the matrix polymer comprises polystyrene, polyacrylate, polyvinyl alcohol, or polyvinylpyrrolidone.

6. The composition as claimed in claim 1, wherein the at least one solvent comprises solvents or solvent mixtures of solvents having in each case a boiling point below 120° C.

7. A process for producing a conductive layer on a surface, comprising:
    a) applying a composition as claimed in claim 1 to a surface; and
    b) removing the at least one solvent.

8. The process as claimed in claim 7, wherein the process does not comprise any treatment of the coating at temperatures above 60° C. after application to the surface.

9. A composite material, comprising:
a composition as claimed in claim 1; and
at least one matrix polymer.

10. A process for producing a composition as claimed in claim 1, comprising:
a) providing a dispersion of conductive metallic nanostructures, with the dispersion being stabilized by at least one first ligand;
b) adding the conductive polymer or oligomer; and
c) replacing at least part of the first ligand by the conductive polymer or oligomer.

11. A display comprising the composite material as claimed in claim 9.

12. A conductor track comprising the composite material as claimed in claim 9.

13. A circuit comprising the composite material as claimed in claim 9.

14. A capacitor comprising the composite material as claimed in claim 9.

15. A solar cell comprising the composite material as claimed in claim 9.

16. The composition as claimed in claim 1, wherein the conductive polymer or oligomer comprises ethylene-3,4-dioxythiophene, 2-(3-thienyl)ethoxy-4-butylsulfonate, poly(ethylene-3,4-dioxythiophene), or poly(2-(3-thienyl)ethoxy-4-butylsulfonate).

17. The composition as claimed in claim 1, wherein the conductive polymer or oligomer has a side chain having at least one polar side group.

18. The composition as claimed in claim 1, wherein the metallic nanostructures comprise a metal, mixture of two or more metals, or an alloy of two or more metals.

19. The composition as claimed in claim 1, wherein the metallic nanostructures comprise gold, silver, copper, platinum, palladium, nickel, ruthenium, indium or rhodium.

20. The composition as claimed in claim 1, wherein the at conductive polymer or oligomer adsorbs on the nanostructure via its conjugated pi system or directly via a functionality in or in the direct vicinity of the conductive polymer backbone.

21. The composition as claimed in claim 1, wherein the at conductive polymer or oligomer has a molecular mass of at least 5 kDa.

22. The composition as claimed in claim 1, wherein the nanostructures are present in at least 10% by weight, based on the composition without solvent.

23. The composition as claimed in claim 1, wherein a degree of coverage of a nanostructure with the conductive polymer or oligomer is at least one monolayer on the total nanostructure surface.

24. A composition, comprising:
a plurality of metallic nanorods;
a conductive polymer or oligomer comprising a thiophene, wherein heteroatoms of the thiophene form at least ten coordinate bonds to a surface of the metallic nanorods; and
at least one solvent comprising water, an alcohol, a ketone, an ether, or mixtures thereof.

* * * * *